United States Patent
Inoue et al.

(10) Patent No.: US 7,463,988 B2
(45) Date of Patent: Dec. 9, 2008

(54) PARAMETER SETTING METHOD AND CIRCUIT OPERATION TESTING METHOD AND ELECTRONIC PROCESSING DEVICE

(75) Inventors: Takayuki Inoue, Kanagawa (JP); Yoshiyuki Kurokawa, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 11/644,350

(22) Filed: Dec. 21, 2006

(65) Prior Publication Data

US 2007/0150250 A1   Jun. 28, 2007

(30) Foreign Application Priority Data

Dec. 27, 2005   (JP) ............... 2005-376716

(51) Int. Cl.
*G06F 17/50* (2006.01)
*G06F 17/00* (2006.01)

(52) U.S. Cl. .................. 702/65; 702/57; 702/117; 703/14; 716/4

(58) Field of Classification Search ............. 702/65, 702/57, 117
See application file for complete search history.

(56) References Cited

U.S. PATENT DOCUMENTS

| | | | |
|---|---|---|---|
| 5,349,539 A | * | 9/1994 | Moriyasu ............ 703/15 |
| 5,993,050 A | * | 11/1999 | Miura .................. 703/2 |
| 6,106,563 A | * | 8/2000 | Stengel et al. ........ 703/13 |
| 6,779,157 B2 | * | 8/2004 | Kondo ............... 716/2 |
| 7,088,618 B2 | * | 8/2006 | Hoshino et al. ...... 365/185.05 |
| 2002/0083406 A1 | * | 6/2002 | Tsai et al. ............ 716/10 |
| 2006/0015858 A1 | | 1/2006 | Tanimoto et al. |

FOREIGN PATENT DOCUMENTS

JP   8-329123   12/1996

OTHER PUBLICATIONS

Iniguez, B. et al, "Unified model for short-channel poly-Si TFTs," Solid-State Electronics, vol. 43, 1999, pp. 1821-1831.

* cited by examiner

*Primary Examiner*—Hal D Wachsman
(74) *Attorney, Agent, or Firm*—Cook Alex Ltd.

(57) ABSTRACT

The invention provides a method for testing a circuit operation (circuit simulation), which is conducted by using a model of high precision. After parameters are extracted by using a model of which physical precision is low and parameter extraction time is short from measurement data, the parameters are converted to those obtained by a model of which parameter extraction time is generally long and a circuit operation test is performed by a model of high physical precision. In other words, a parameter is extracted first by a model of low physical precision and then, the extracted parameter is converted into a parameter obtained by the model of high physical precision. Finally, a circuit operation test is performed by using the model having high physical precision.

20 Claims, 5 Drawing Sheets

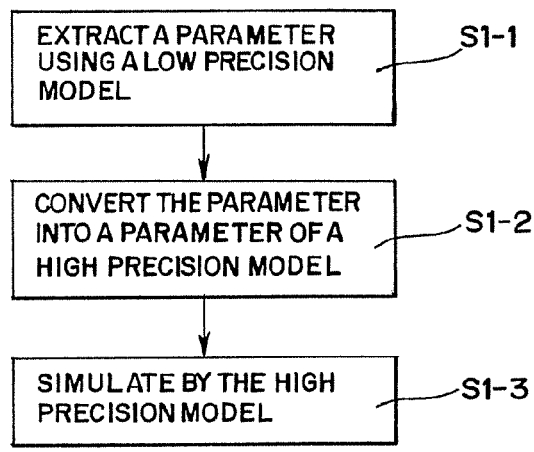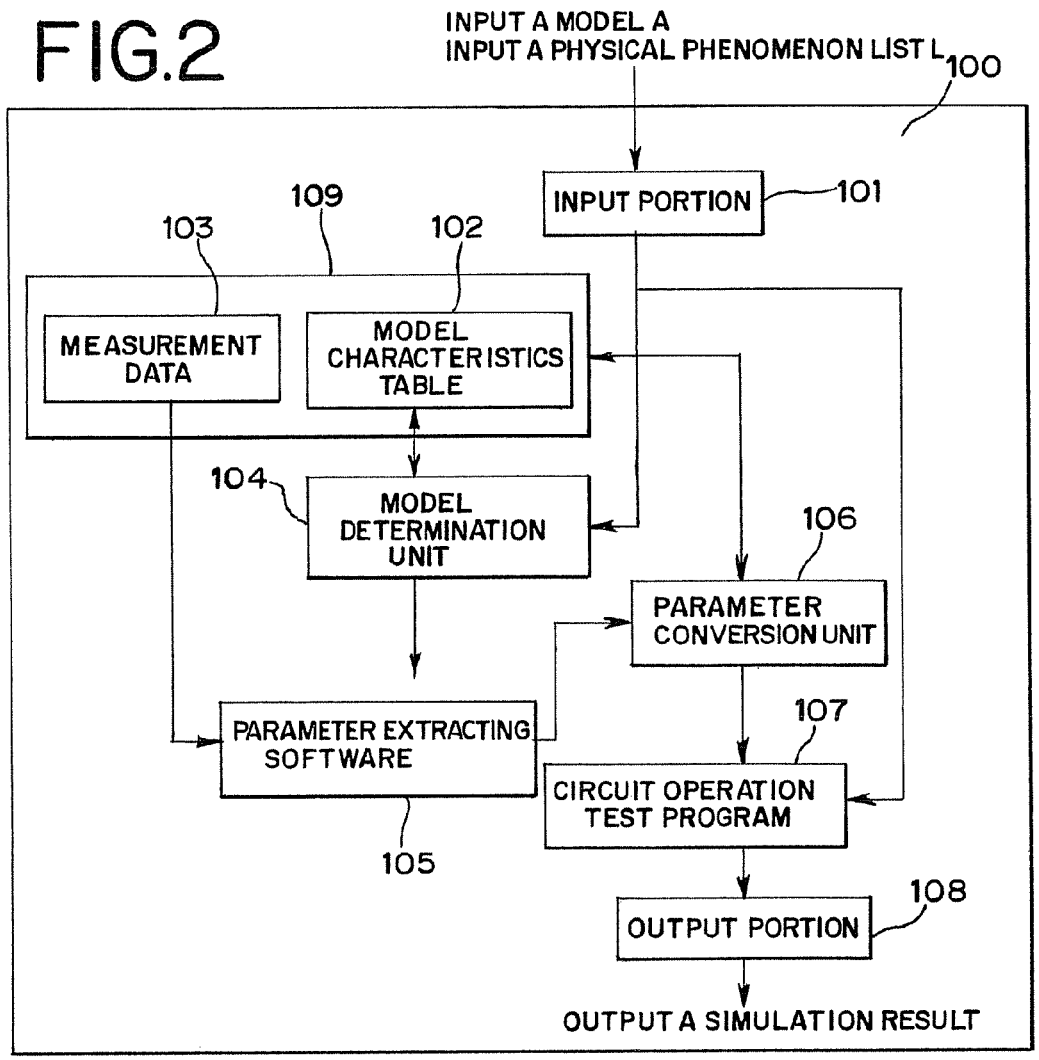

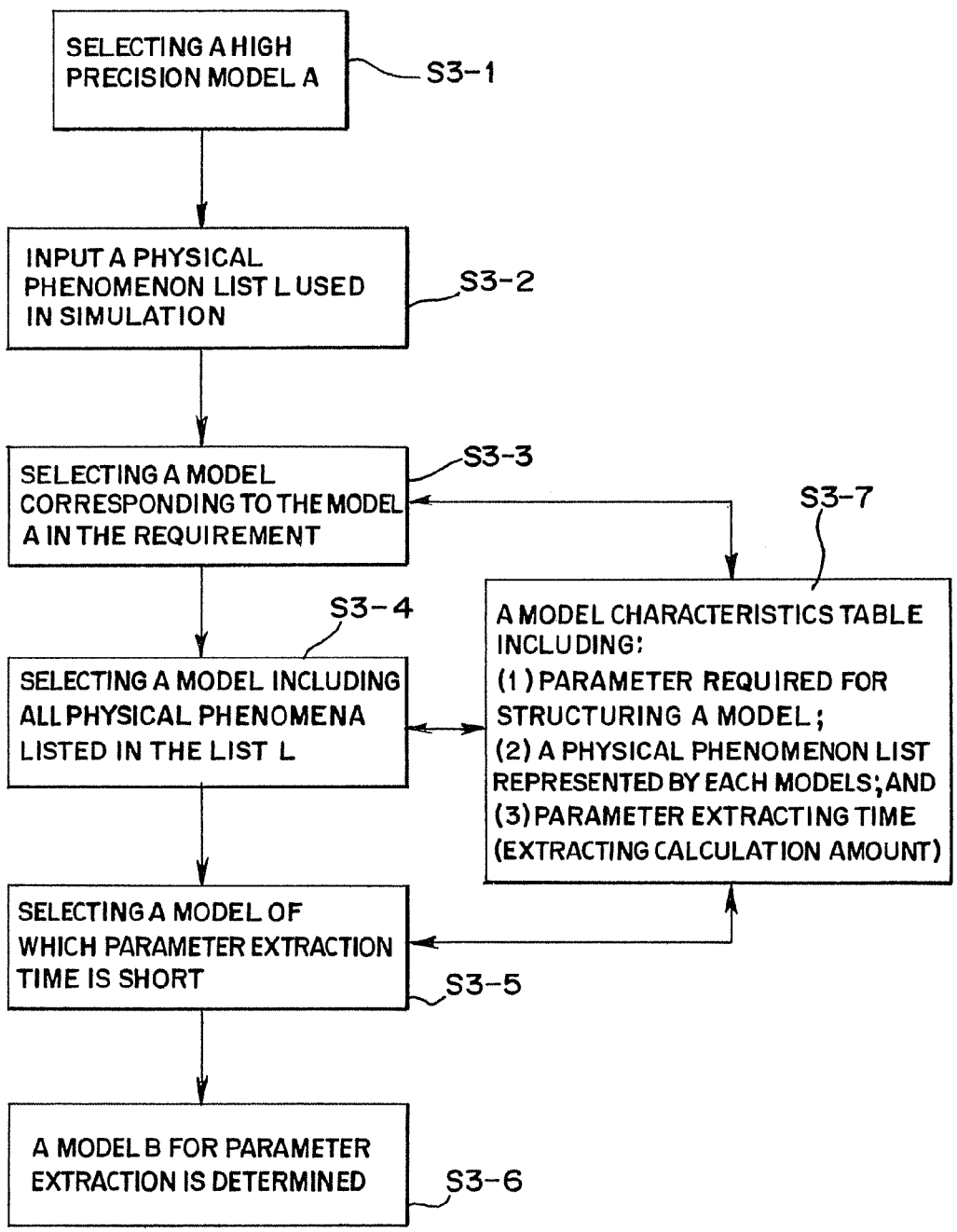

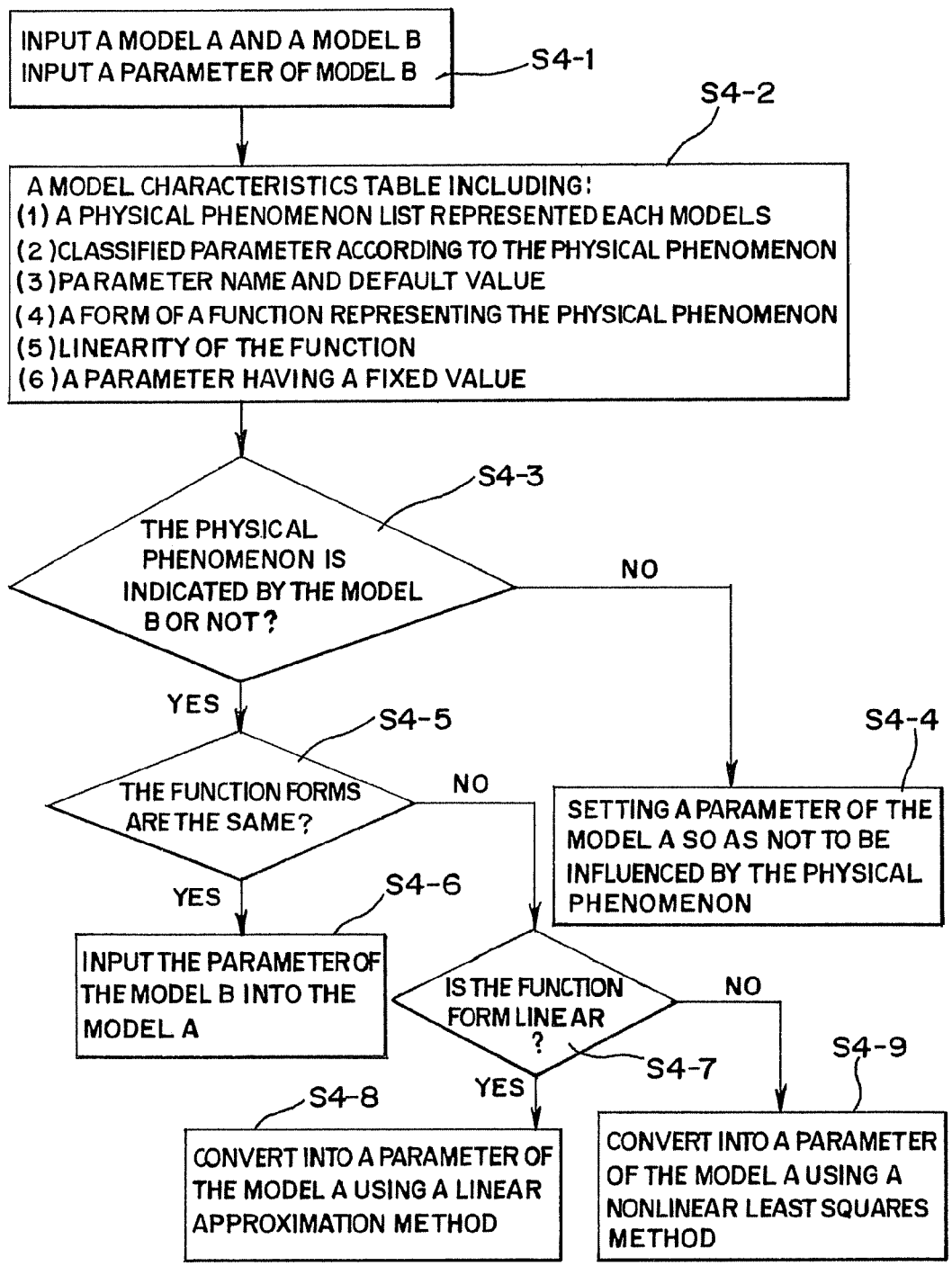

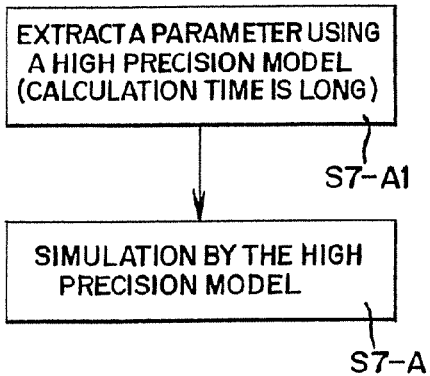
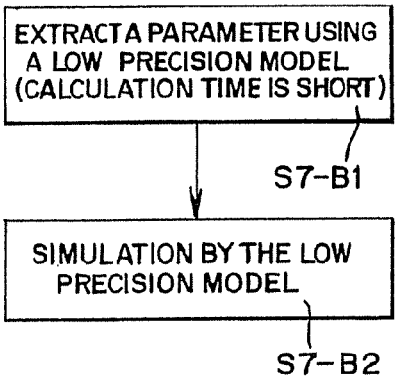
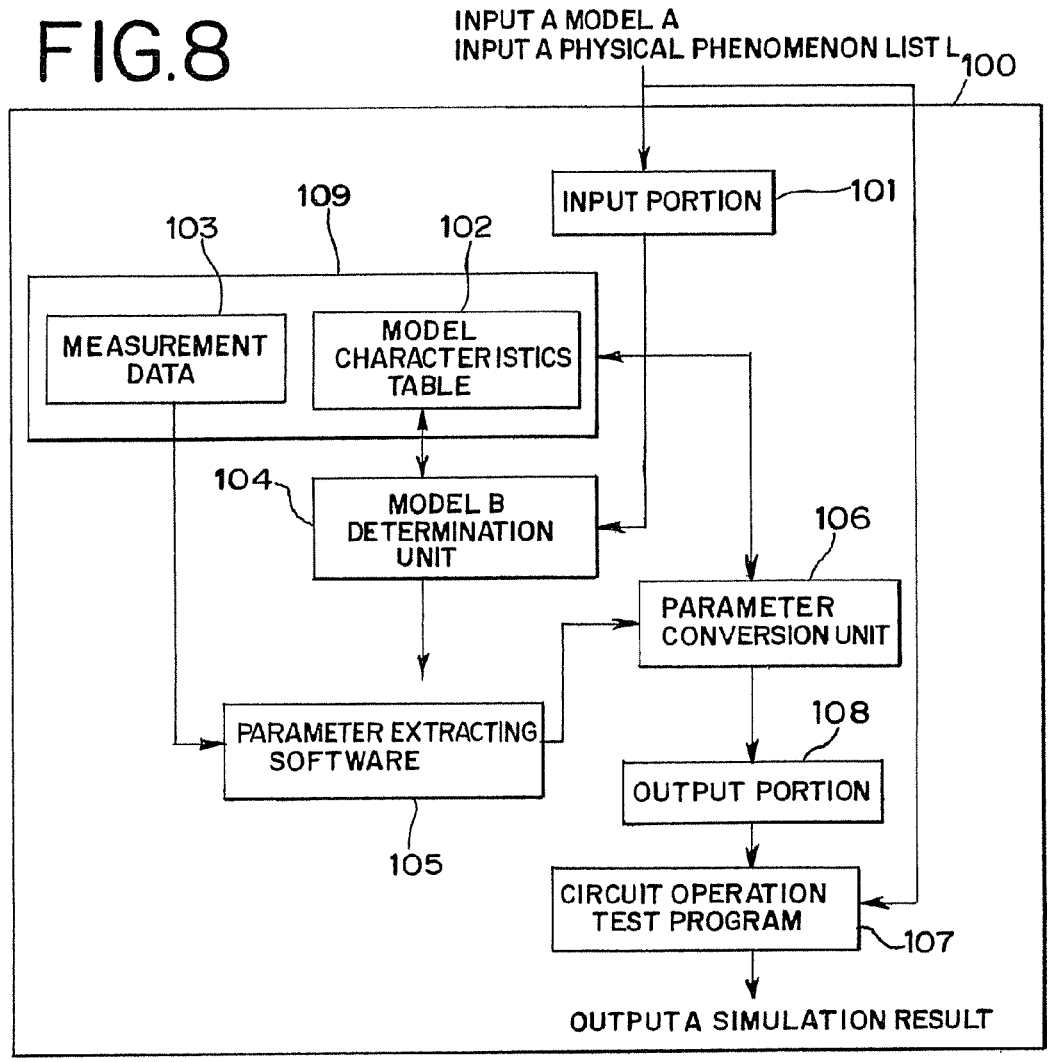

PARAMETER SETTING METHOD AND CIRCUIT OPERATION TESTING METHOD AND ELECTRONIC PROCESSING DEVICE

This application is based on Japanese Patent Application Ser. No. 2005-376716 filed in Japan Patent Office on 27th, Dec. 2005, the entire contents of which are hereby incorporated by reference

BACKGROUND OF THE INVENTION

1. Field of the Invention

The present invention relates to a parameter setting method and a parameter setting device of a model which approximates circuit element characteristics when a circuit operation is tested. In addition, the invention relates to a circuit operation testing method and a circuit operation testing device.

2. Description of the Related Art

A circuit operation test (also referred to as a circuit simulation) is performed for the purpose of finding a defect in a circuit design as soon as possible and predicting performance. A designed circuit is modified or improved based on a calculation result of a circuit operation test. When a circuit operation is tested, a parameter obtained by a model for indicating characteristics of an element included in a circuit is required. A parameter obtained by a model is determined depending on a manufacturing process or a size of a device, or determined by using software (hereinafter referred to as a tool) for extracting a parameter in accordance with electric characteristics obtained by measuring a device.

For a circuit operation testing program, for example, SmartSpice® (manufactured by Silvaco International), or the like can be used. For software (tool) for extracting a parameter, UTMOST (manufactured by Silvaco International) can be used. Besides, products marketed by Synopsys, Inc. and Cadence Design Systems, Inc. are given.

For a circuit operation test of a thin film transistor (hereinafter referred to as TFT), a model according to a physical phenomenon indicating electrical characteristics that might affect a TFT, which should be considered, is used. As such a model, there is a classical model called gradual channel approximation or depletion layer approximation, an RPI model, or the like. In the aforementioned SmartSpice®, a LEVEL number is given for each model. A model of a large LEVEL number tends to have high physical precision and a large number of parameters. Meanwhile, a model of a small LEVEL number has a small number of parameters, but physical precision thereof is low. For example, improved depletion layer approximation is LEVEL 2, and an RPI model is LEVEL 36.

In order to extract a parameter obtained by a model used for a circuit operation test, the model is required to be determined by obtaining measurement data. Selection of a model is significant for a circuit operation test. A parameter is extracted based on a nonlinear least squares method in a process of software. In the nonlinear least squares method, various factors are necessarily considered, such as handling in the case of having a plurality of minimum values, a determination condition of a loop concerning convergence, and a processing method of values, and a lot of devices are required for them. The various factors are unique properties of software (tool) for extracting a parameter; therefore, even when the same measurement data is used, a different value is extracted depending on software (tool). In the case of a simple model, a model formula can be expressed by a linear coupling of a parameter, so that a calculation can be performed without using marketed software (tool). The calculation result is led having some differences in calculation quantity in the calculation process, which are not large, by an algorithm.

In the nonlinear least squares method, in principle, an enormous quantity of calculations is required to be performed for obtaining a proper value. When a parameter is actually extracted by using a model of LEVEL 36, it takes approximately 10 minutes for data of one curve. However, when a parameter is extracted by using a model of LEVEL 2 for example, not so many linear portions are included. Therefore, simple software (tool) can extract the parameter, and even data of 100 curves can be extracted in just a few seconds.

SUMMARY OF THE INVENTION

Improvement in speed for developing a circuit design is an extremely significant object, and it is needless to say that time taken for a circuit operation test which is a part of a development flow has to be reduced. However, extracting a large quantity of parameters by using a model having a large LEVEL number takes much time, and is often difficult for performance of a current calculator. Therefore, when there is not enough developing time, a parameter is extracted by a model having low physical precision to perform a circuit operation test. However, the test is not effected unless a model for parameter extraction is the same as that used for a circuit operation test. FIGS. 7A and 7B show schematic diagrams of the aforementioned. A model of high physical precision (model of a large LEVEL number) has high physical precision of a circuit operation test result, but it takes much time to extract parameters from measurement data since the model has a large number of parameters. Conversely, a model of low physical precision (model of a small LEVEL number) has low physical precision of a circuit operation test result, although it takes a short time to extract parameters from measurement data since the model has a small number of parameters. Further, in order to perform a circuit operation test by using a model of high physical precision, a certain period of time is always required for parameter extraction. The calculation time depends on performance of software (tool) used for extraction and a CPU; therefore, it cannot be reduced by originality and ingenuity of an engineer. If a circuit operation test can be performed by using a model of high physical precision in a short time, it effectively supports a circuit design, so that developing speed is improved.

In order to solve the aforementioned problems, a parameter is extracted by using a model having low physical precision first. Then, the extracted parameter is converted into a parameter obtained by a model having high physical precision. Finally, a circuit operation test is performed by using the model having high physical precision.

One aspect of the invention is an electronic processing device for setting a parameter. The electronic processing device includes a first storage unit storing a model characteristics table which has a plurality of electronic element characteristics and physical phenomenon lists thereof; a second storage unit storing measurement data of an electronic element; and a processor including a program. The program is to execute the steps of reading a first model of a circuit element characteristic, and a physical phenomenon list thereof; calling a second model of a circuit element characteristic from the model characteristics table on the basis of the physical phenomenon list of the first model of a circuit element characteristic; obtaining a parameter of the second model by using the measurement data; and converting the obtained parameter of the second model of a circuit element characteristic so as to meet the first model of a circuit element characteristic. Further, aspect of the invention is the electronic processing device in which the circuit element in each of the first and second models is a thin film transistor. Further, aspect of the invention is the electronic processing device in which the first model of a circuit element characteristic has higher physical precision than the second model of a circuit element characteristic. Further, another aspect of the invention is an electronic processing device for testing a circuit operation. The electronic processing device for testing a circuit operation includes a processor including a second program to test a circuit operation by using the converted parameter and the first model of a circuit element characteristic.

One aspect of the invention is a parameter setting method for setting a parameter obtained by a model which approximates circuit element characteristics in accordance with a physical phenomenon that affects a circuit element used for testing a circuit operation. The method includes a step of inputting a first model and a physical phenomenon list of the first model into a processor; a step of selecting a second model from a model characteristics table in which a plurality of models and physical phenomenon lists of the plurality of models are stored, based on the physical phenomenon list of the first model in the processor; a step of extracting a parameter of the second model by using measurement data in the processor; and a step of converting the extracted parameter by the second model into so as to correspond to the first model in the processor. Further, another aspect of the invention is a parameter setting method having the aforementioned structure, the first model has higher physical precision than the second model.

Further, one aspect of the invention is a circuit operation testing method for setting a parameter obtained by a model which approximates circuit element characteristics in accordance with a physical phenomenon that affects a circuit element used for a circuit operation test, and for testing a circuit operation by using the model. The method includes a step of inputting a first model and a physical phenomenon list of the first model into a processor; a step of selecting a second model from a model characteristics table in which a plurality of models and physical phenomenon lists of the plurality of models are stored based on the physical phenomenon list of the first model in the processor; a step of extracting a parameter of the second model by using measurement data in the processor; a step of converting the extracted parameter by the second model so as to correspond to the first model in the processor; and a step of testing a circuit operation by using the first model and the converted parameter.

Further, another aspect of the invention is a circuit operation testing method having the aforementioned structure, the first model has higher physical precision than the second model.

Further, one aspect of the invention is a parameter setting device for setting a parameter obtained by a model which approximates circuit element characteristics in accordance with a physical phenomenon that affects a circuit element used for a circuit operation test. The parameter setting device includes an input unit for inputting a first model and a physical phenomenon list of the first model; a model characteristics table in which a plurality of models and physical phenomenon lists of the plurality of models are stored; a model determination unit for determining a second model from the model characteristics table based on the first model and the physical phenomenon list of the first model; parameter extracting software (tool) for extracting a parameter of the second model by using measurement data; and a parameter conversion unit for converting the parameter obtained by the second model so as to correspond to the first model.

Further, another aspect of the invention is a parameter setting device having the aforementioned structure, the first model has higher physical precision than the second model.

Further, one aspect of the invention is a circuit operation testing device for setting a parameter obtained by a model which approximates circuit element characteristics in accordance with a physical phenomenon that affects a circuit element used for a circuit operation test, and for testing a circuit operation by using the model. The circuit operation testing device includes an input unit for inputting a first model and a physical phenomenon list of the first model; a model characteristics table in which a plurality of models and physical phenomenon lists of the plurality of models are stored; a model determination unit for determining a second model from the model characteristics table based on the first model and the physical phenomenon list of the first model; parameter extracting software (tool) for extracting a parameter of the second model by using measurement data; a parameter conversion unit for converting the parameter obtained by the second model so as to correspond to the first model; and a circuit operation testing program for testing a circuit operation by using the first model and the converted parameter.

Further, another aspect of the invention is a circuit operation testing device having the aforementioned structure, the first model has higher physical precision than the second model.

By the invention mentioned above, a circuit operation test can be performed with higher physical precision and in shorter calculation time than before.

Further, by the invention mentioned above, it becomes easier to modify the model characteristics table, the model determining method, and the parameter converting method. Accordingly, the quantity of calculations can be reduced, and physical precision can be easily improved.

Therefore, a semiconductor device can be effectively designed by using the invention mentioned above.

BRIEF DESCRIPTION OF DRAWINGS

FIG. 1 is a schematic diagram of a suggested flow showing parameter extraction and a circuit operation test (circuit simulation).

FIG. 2 is a block diagram showing a structure of a circuit operation testing device (circuit simulation device).

FIG. 3 is a flow chart of a method for determining a model B.

FIG. 4 is a flow chart of a method for converting from a parameter obtained by a model B to that obtained by a model A.

FIGS. 7A and 7B are schematic diagrams of a conventional flow showing extraction of a parameter and a circuit operation test (circuit simulation).

FIG. 8 is a block diagram showing a structure of a circuit operation testing device (circuit simulation device).

DETAILED DESCRIPTION OF THE INVENTION

Embodiment Mode

Figure 5:
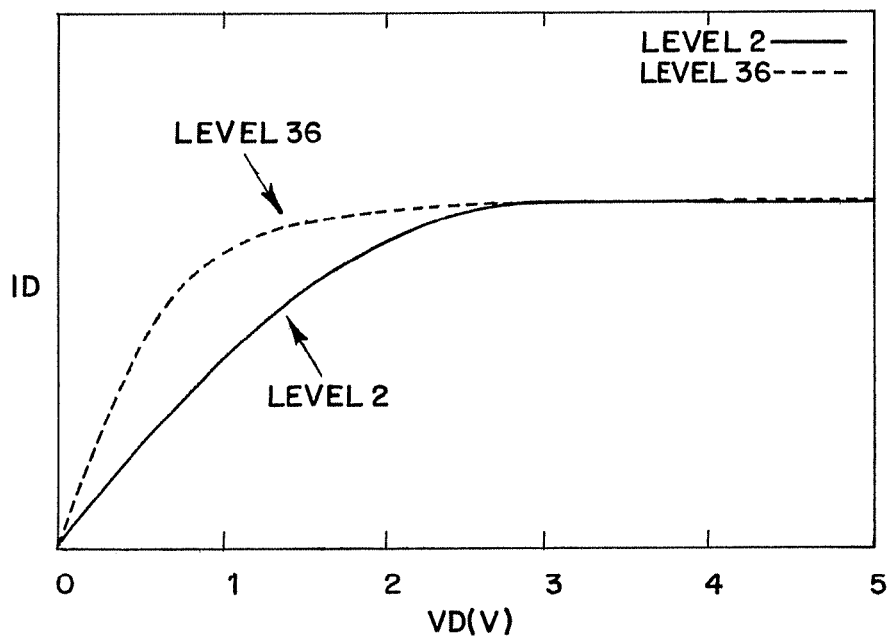
FIG. 5 shows a VD-ID curve of LEVEL 2 drawn using an extracted parameter, and a VD-ID curve of LEVEL 36 drawn using the extracted parameter which is converted into that for LEVEL 36.

Although the invention will be fully described by way of an embodiment with reference to the accompanying drawings, it is to be understood that various changes and modifications will be apparent to those skilled in the art. Therefore, unless such changes and modifications depart from the spirit and the scope of the invention, they should be construed as being included therein.

FIG. 1 shows a schematic diagram of parameter extraction and a circuit operation test relating to the invention. First, a parameter is extracted by using a model of which parameter extraction time is short and physical precision is low. Next, the extracted parameter is converted into a parameter obtained by a model having high physical precision. Then, a circuit operation test is performed by using the model having high physical precision. That is, in the embodiment mode of the invention, a model for parameter extraction differs from that for a circuit operation test.

FIG. 2 is a block diagram showing a structure of a circuit operation testing device of the embodiment mode of the invention. A model A (first model) having high physical precision, which is for an actual circuit operation test, and a list L of a physical phenomenon to be considered in the circuit operation test are inputted to an input portion 101. Here, the input portion 101 may have a storage unit for temporarily storing the inputted model A and the physical phenomenon list L. A model characteristics table 102 is used when a model B (second model) of which physical precision is low but parameter extraction time is short is selected and when a parameter obtained by the model B is converted into that obtained by the model A. Measurement data 103 is inputted in advance. A database of the model characteristics table 102 and the measurement data 103 is made and stored in a storage unit 109. The model B determined by a model determination unit 104 and the measurement data 103 are used to extract a parameter by using the model B by parameter extracting software (tool) 105. In a parameter conversion unit 106, the parameter extracted by the model B is converted into a parameter obtained by the model A for a circuit operation test. The parameter obtained by the model A, which is converted in a circuit operation test program 107, is used to perform the circuit operation test, and a result is outputted from an output portion 108.

Note that a processor 100 (simulation device) shown in FIG. 2 includes the input portion 101, the storage unit 109 (for storing the measurement data 103 and the model characteristics table 102), the model determination unit 104, the parameter extracting software (tool) 105, the parameter conversion unit 106, the circuit operation test program 107, and the output portion 108. As shown in FIG. 8, the circuit operation test program 107 may be provided separately from a parameter setting device. That is, the parameter setting device is a processor including the input portion 101, the storage unit 109 (for storing the measurement data 103 and the model characteristics table 102), the model determination unit 104, the parameter extracting software (tool) 105, the parameter conversion unit 106, and the output portion 108. Therefore, in a case of the structure of FIG. 8, the parameter extracted by the model B is converted into a parameter obtained by the model A by the parameter conversion unit 106, and the converted parameter obtained by the model A is outputted from the output portion 108. Then, the parameter obtained by the model A, which is outputted from the output portion 108, the model A, and the physical phenomenon list L of the model A are inputted to the circuit operation test program 107, and a result of the circuit operation test is outputted from the circuit operation test program 107.

The model characteristics table 102 includes (1) a model name (LEVEL), (2) a requirement for a model, (3) a list of a physical phenomenon indicated by each model, (4) parameter extraction time (the quantity of extraction calculation), (5) a parameter name and a default value of the parameter, (6) parameters categorized by physical phenomena, (7) a form of a function expressing a physical phenomenon, (8) linearity of the expressed function, (9) a parameter having a fixed value, and the like. The model B is determined based on the data by the model determination unit 104 in FIG. 2, and the parameter obtained by the model B is converted into that obtained by the model A by the parameter conversion unit 106.

As described above, a parameter is extracted just in a short time. Next, physical precision is considered. There are two points to which attention should be paid. A first point is how to select a model for a parameter to be extracted, and a second point is how to convert the extracted parameter. In the embodiment mode of the invention, a parameter is extracted by using a model of a small LEVEL number; therefore, the calculation quantity is small. However, the parameter is extracted by using a model of low physical precision, so that a physical phenomenon which is not indicated by the model is eliminated when the extraction is performed. In other words, first, it is important to select a model including a physical phenomenon not to be eliminated when a model of low physical precision is selected among a plurality of choices.

As for a parameter converting method, a parameter of which a corresponding relation between a model of low physical precision and a model of high physical precision is clear is easily converted. However, even a parameter indicating the same physical phenomenon has a different function form to be expressed in some cases. In those cases, on what basis a parameter is converted affects physical precision of a circuit operation test.

FIG. 3 shows a flow chart of how to determine a model for extraction when a model of high physical precision for a circuit operation test is selected and a physical phenomenon to be considered in the circuit operation test is determined. A flow of FIG. 3 is described in detail.

First, a model of high physical precision is selected for a physical phenomenon on which a circuit operation test is to be performed. Here, the model of high physical is precision, for which the circuit operation test is performed, is fixed. In a step S3-2, the list L of a physical phenomenon to be considered in the circuit operation test is inputted to the input portion 101 in FIG. 2. If the physical phenomenon list L is similar to a list of a physical phenomenon indicated by the model A, the model B to be naturally selected has physical precision of the same degree as the model A. However, attention should be paid to that the calculation quantity for parameter extraction is increased.

In a step S3-3, a model which has a requirement corresponding to that of the model A is selected from the model characteristics table. However, as for models of Spice, requirements for both models are not necessarily considered so much. This is because both models are effected concerning the range of a gate voltage and a drain voltage, the channel length (width), the thickness of a gate oxide film, and the like with almost the same requirement. In handling a general physical model, it is required to sufficiently understand that a model is effected when assigned with what requirement. Actually, a processor automatically selects a model which has a requirement corresponding to that of the model A by using the model characteristics table in the S3-3.

In a step S3-4, a model including all physical phenomena listed in the list L of the physical phenomenon to be considered in the circuit operation test is selected among models selected in the step S3-3. In the model characteristics table (S3-7), parameters are categorized by physical phenomena. Further, there are various kinds of parameters. For example, a coefficient induced by solving a physical partial differential equation, a parameter which does not have a physical effect but is given for a purpose of fine adjustment of a calculation, and the like are given. However, parameters are categorized by each phenomenon indicated by a physical model here. The aforementioned phenomenon is not completely independent, but is often indicated as an independent form in terms of a physical model; therefore, it can be said that each parameter relates to the physical phenomenon. Categorizing parameters obtained by the model A and the model B also corresponds to understanding that each model indicates which physical phenomenon. The model A of high physical precision has a form including more physical phenomena.

In a step S3-5, a model of which parameter extraction time is short is selected among the models selected in the step S3-4. The parameter extraction time is expressed by the calculation quantity required for extraction. Data of the calculation quantity is stored in the model characteristics table, and a model is selected based on the data. Since a model of which parameter extraction time is the shortest is selected, the model is clearly determined. In a S3-6, a model B for parameter extraction is determined.

FIG. 4 shows a flow chart of how to convert an extracted parameter when a model for parameter extraction and a model for a circuit operation test are set.

A known physical model and a known parameter for expressing the model can be used in the embodiment mode of the invention. Further, existing parameter extracting software (tool) and an existing circuit operation test program may be used.

In the embodiment mode of the invention, a model for parameter extraction is determined using the model characteristics table stored in the database, and parameter conversion is performed between two models.

Description is made of a flow chart of FIG. 4. The model A is inputted to the input portion 101 in FIG. 2, and the model B is determined by the model determination unit 104 in FIG. 2. A parameter is converted using a regular procedure based on these two models, and a parameter obtained by the model B (S4-1) and a model characteristics table (S4-2), which are extracted from measurement data in the parameter extracting software (tool) 105 in FIG. 2.

In a step S4-3, whether a physical phenomenon indicated by the model A is indicated by the model B is checked. If the physical phenomenon is not indicated, a step S4-4 is conducted. The parameter extracted by using the model B indicates only a physical phenomenon which is originally indicated by the model B. Thus, a parameter obtained by the model A is set so that an effect by a physical phenomenon not indicated by the model B but indicated by the model A is eliminated. If the eliminated effect is desirably considered, it is required that another model be selected as the model B or a parameter be extracted by using the model A. In an algorithm for setting a parameter so that an effect by a physical phenomenon is eliminated, a parameter categorized into the physical phenomenon is extracted first. The model characteristics table shows that which parameter belongs to which physical phenomenon. Next, a parameter is set so that a function is identically 0 by using the function form for expressing the physical phenomenon stored in the model characteristics table. Depending on a case, a certain parameter may have any value. In that case, a default value is adopted.

In the case of a physical phenomenon included in both the model A and the model B, a step S4-5 is conducted, and the function forms expressing the physical phenomenon are checked. When the function forms are the same or essentially the same, a step S4-6 is conducted. The case of being essentially the same corresponds to a case where a function has a parameter name and expression of the parameter which are slightly different from those of the other function, but is just multiplied by a constant in terms of a formula. The parameter extracted by using the model B is substituted as it is (or with the parameter multiplied by a constant) for the corresponding parameter obtained by the model A. In the case where the functions have the same parameter name, and the like, the S4-6 can be most easily conducted. Note that the algorithm for conversion does not include an individual interpretation; therefore, there is no difference between engineers.

It may be that even when the same phenomenon is indicated, formula forms vary. In that case, a step S4-7 is selected. A straight-line form means that the function forms can approximate to each other concerning a parameter with a linear function. However, the function forms can approximate to each other in a few cases, and a step S4-9 is selected in many cases. Here, description is made of an algorithm for determining whether a function form is straight-line or not. When the function form is straight-line, a slope of the function is settled; therefore, the function form is determined as a linear form if the slope does not change so much relatively. Thus, in a case where an average value of the slope and standardized variance of the function expressed by a physical phenomenon are figured out, and the standardized variance is a certain value or less, the function form may be determined as a straight-line form. In the model characteristics table, whether the function form is linear or nonlinear is described in advance. When the function form is linear, a conversion equation with respect to the slope and an intercept of the function is also stored at the same time.

In the step S4-9, a parameter is converted into a parameter obtained by the model A by the nonlinear least squares method such as Newton Method. When the function form of the model A is different from that of the model B even in the case where the same phenomenon is indicated by the models, and the function forms are nonlinear with respect to a parameter, there are few measures for conversion. Here, a portion expressing the phenomenon is extracted by using the model B, and a graph is formed. Then, fitting is performed for a corresponding function of the model A by the nonlinear least squares method. As a calculation method, the same method as that performed by parameter extracting software (tool) is employed. The calculation quantity of the model B is quite less than that of the model A for which fitting is performed as a whole, because partial extraction is performed in the case of the model B. In order to perform a calculation more accurately by the nonlinear least squares method, it is required that a function for which fitting is performed be partially differentiated analytically instead of a difference method, or the like. Accordingly, a complicated function has to be handled. For the purpose of avoiding this, a parameter which has a small effect is adjusted manually, fixed, or the like when fitting is performed. As a result, the calculation quantity can be reduced. As for the step S4-9, it concerns an interpretation of a model and approximation by an engineer. In the whole flow, this step including nonlinearity is the most difficult, and for the step, a calculation algorithm is devised. Depending on a calculation method, a parameter is converted to have a different value.

Here, some of parameters of LEVEL 36 which are ignorable are eliminated. However, when a part of electrical characteristics is desirably adopted, a following measure may be taken: to increase the number of physical phenomena to be inputted to the input portion 101 in FIG. 2; to improve the model characteristics table 102 in FIG. 2; to modify a converting method of the parameter conversion unit 106 in FIG. 2; or the like.

Originally, time for parameter extraction of LEVEL 36 is fixed; therefore, there is no measure for reducing the time except for improvement of performance of a calculator. However, in the embodiment mode of the invention, it is attempted that the calculation time is reduced by a procedure of extracting a parameter of LEVEL 2 first. By the embodiment mode of the invention, latitude of the calculation time for parameter extraction can be improved.

Note that in the embodiment mode of the invention, a known physical model and a known parameter for expressing the model may be used instead of forming a new model and a new parameter.

In embodiment mode of the invention, a parameter is extracted by using a model of low physical precision; therefore, a physical phenomenon not indicated by the model is eliminated when the extraction is performed. Thus, it is important to select a model which includes as much as possible a physical phenomenon not to be eliminated when selecting a model of low physical precision among a plurality of choices. Note that elimination means to eliminate a representation except various extracted representations from an object to be considered in extracting a concept.

By the embodiment mode of the invention, a circuit operation test can be performed with higher physical precision in shorter calculation time than before.

Further, by the embodiment mode of the invention, it becomes easier to modify the model characteristics table, the model determining method, and the parameter converting method. Accordingly, the calculation quantity can be reduced, and physical precision can be easily improved.

Therefore, a semiconductor device can be effectively designed by using the embodiment mode of the invention.

Further, the embodiment of the invention is effective when a circuit operation test is performed with a model of high physical precision.

Embodiment 1

In this embodiment, by applying one aspect of the invention, a parameter of LEVEL 2 of SmartSpice® is actually converted into that of LEVEL 36 in accordance with FIGS. 2 to 4. LEVEL 36 is selected because it represents best TFT (Thin Film Transistor) characteristics to be required, under the circumstances. A particular physical phenomenon to be considered is only channel length modulation, By the model determination unit 104 in FIG. 2, a model for parameter extraction is determined in accordance with FIG. 3. In the case of Spice, requirements for models are almost the same, and channel length modulation is employed for many models. LEVEL 2 is selected because there is simple parameter extracting software (tool), and parameter extraction time is extremely short. Further, LEVEL 2 is a model which has a simple form but expresses a certain degree of property, which is often used in general, so that it is easy to be handled, and suitable for parameter extraction.

By simple parameter extracting software (tool), a parameter of LEVEL 2 is partially extracted. A parameter having a small effect is fixed at a default value to significantly reduce the calculation quantity. As for a drain voltage and a gate voltage, the channel length (width), and the thickness of a gate insulating film, the same value is used for every model. Assuming that a parameter be extracted from the measurement data by the parameter extracting software (tool) 105 in FIG. 2, a step of parameter conversion is conducted by the parameter conversion unit 106 in FIG. 2.

Next, a process is performed in accordance with the flow chart in FIG. 4. LEVEL 36 and LEVEL 2 are employed as models, and a parameter extracted by simple software (tool) exclusively for LEVEL 2 is inputted in the step of S4-1.

In the step of S4-2, various data are taken out from the model characteristics table. Physical phenomena indicated by LEVEL 36 and LEVEL 2 respectively, and a parameter name and a default value of parameters categorized by physical phenomena are described. A function form expressing the physical phenomenon and linearity thereof are read in.

After that, the step of S4-3 is conducted. Both formulas express a drain current, but a property to be considered when the value is led is different between the two models. Common physical phenomena of LEVEL 2 and LEVEL 36 are (1) channel length modulation, (2) a subthreshold leak current, and (3) mobility deterioration. These physical phenomena are listed in the model characteristics table. However, the physical phenomena except (1) are eliminated for simplification in this embodiment. This is settled in the list L of a physical phenomenon to be considered in a circuit operation test, which is inputted in the step S3-2. First, a parameter of LEVEL 36 is set as follows. That is to say, (2) IO =0, IOO =Default, BLK =Default, DD =Default, and DG =Default, and (3) THETA =0 and MUS =0 are satisfied. It is to be noted that "IO", "IOO", "BLK", "DD", and "DG" are parameter names. Further, it is to be noted that Default is a value listed in Manual of SmartSpice®. An algorithm for setting Default value is formed assuming that since the parameter is the one included in a portion which becomes 0 as a whole, the parameter may be any value.

Physical phenomena indicated only by LEVEL 36 are (4) a kink effect, (5) temperature dependency, and (6) DIBL (Drain Induced Barrier Lowering). (These physical phenomena are listed in the model characteristics table.) Therefore, after the step of S4-3, the step of S4-4 is conducted for (4) to (6).

A parameter concerning (4) to (6) is set so that an effect of the phenomena (4) to (6) is made 0 in a model formula. In the middle of the process, specific values are as follows. (4) LKINK=META=0, VKINK=Default, and MK=Default; (5) DVT=DMU1=LASAT=DASAT=0, ASTA=1, and TNOM=Default; and (6) AT=BT=0, VSI=Default, and VST=Default are satisfied. It is to be noted that "LKINK", "META", "VKINK", "MK", "DVT", "DMU1", "LASM", "DASAT", "ASTA", "TNOM", "AT", "BT", "VSI", and "VST" are parameter names.

Before the step of S4-5 is conducted, formulas of a drain current of LEVEL 2 and LEVEL 36 are described.

Vgs represents a gate voltage, vds represents a drain voltage, ids represents a drain current, VTO represents a 0 bias threshold voltage, and LAMBDA represents channel length modulation. Values thereof are common between both models.

First, a formula of a drain current of LEVEL 2 is expressed. Note that the formula, that is, gradual channel approximation to which channel length modulation is added is led to be used by ignoring an effect given to a depletion layer by a drain voltage assuming that GAMMA (Bulk threshold parameter)

be set to 0, here. For further simplification, DELTA (Narrow width threshold adjusting factor) is set to 0.

When vgs>VTO is satisfied, a drain current is expressed by following Formula 1.

$$ids = U0 \cdot Cox \cdot \frac{W}{L} \cdot \left(vgs - VTO - \frac{1}{2} \cdot vde\right) \cdot vde \cdot (1 + LAMBDA \cdot vds) \quad \text{[Formula 1]}$$

A linear region and a saturation region are expressed as one formula, assuming that vde=min (vds, vdsat) be satisfied. U0 represents surface mobility. Here, vdsat=max (vg−VTO, 0) is defined. Further, Cox=εr·ε0/Tox is defined. Note that er represents specific inductive capacity of a gate oxide film, ε0 represents an electric constant, and Tox represents the thickness of a gate oxide film. Here, an approximation formula of following Formula 2 is further used.

$$\frac{1}{1 - LAMBDA \cdot vds} = \frac{1 + LAMBDA \cdot vds}{1 - LAMBDA^2 \cdot vds^2} \quad \text{[Formula 2]}$$
$$\cong 1 + LAMBDA \cdot vds$$

This is approximation for easily determining following correspondence to LEVEL 36. Parameters such as VTO, U0, and LAMBDA are extracted by extraction software (tool).

Next, a formula of a drain current of LEVEL 36 (version 2.0) is expressed. In order to clarify a model formula, DELTA (Transition width parameter), RSeff (Effective source resistance), RDeff (Effective drain resistance) are set to 0. When a parameter of LEVEL 36 is set so that the aforementioned (2) to (6) are satisfied, the formula is partially simplified. Ids=Ids1, Δkink=Ileak=0, Gch=Gchi, Vgte=Vgt=vgs−vteff, vteff=Vtx=Vt=VTO, µeff=µFET, and Eta=ETA are satisfied. Therefore, a drain current is expressed by following Formula 3.

$$I_{ds} = \frac{Gch \cdot vds \cdot (1 + LAMBDA \cdot vds)}{\left[1 + \left(\frac{vds}{vdsat}\right)^{ME}\right]^{\frac{1}{ME}}} \quad \text{[Formula 3]}$$

Gch and vdsat depend on vgs, and they are expressed by following Formulas 4 and 5 respectively.

$$Gch = \quad \text{[Formula 4]}$$
$$2 \cdot \mu_{eff} \cdot \frac{W}{L} \cdot F_{cox} \cdot ETA \cdot V_{th} \cdot \ln\left(1 + \frac{1}{2} \cdot \exp\left(\frac{vgs - VTO}{ETA \cdot V_{th}}\right)\right)$$

$$vdsat = \frac{vgs - VTO}{1 + \frac{vgs - VTO}{VI} + \sqrt{1 + \left(1 + \frac{vgs - VTO}{VI}\right)^2}} \quad \text{[Formula 5]}$$

Fcox represents a capacity of an oxide film per unit area, and ETA represents a parameter named Subthreshold ideality factor. Therefore, VI in Formula 5 is expressed by following Formula 6.

$$VI = 2 \cdot VMAX \cdot \frac{L}{\mu_{eff}} \quad \text{[Formula 6]}$$

µeff in Formula 6 depends on vgs, and is expressed by following Formula 7.

$$\frac{1}{\mu_{eff}} = \frac{1}{MU0} + \frac{1}{MU1 \cdot \left(\frac{2 \cdot (vgs - VTO)}{ETA \cdot V_{th}}\right)^{MMU}} \quad \text{[Formula 7]}$$

Vth in Formula 7 is a parameter depending on temperature, and expressed by following Formula 8.

$$V_{th} = \frac{k \cdot temp}{q} \quad \text{[Formula 8]}$$

VMAX, MU0, MU1, and MMU represent saturation velocity, high electric field mobility, a parameter of low electric field mobility, and low electric field mobility index, respectively. k, q, and temp represent a Boltzmann constant, the charge amount of an electron, and temperature (° C.), respectively.

Here, when MU1=0.0025 (default=0.0022), and MMU=2.5 (default=1.7) are approximately satisfied, µeff≈MU0 is satisfied. A parameter having a fixed value is inputted in the model characteristics table in advance to reduce the calculation quantity concerning fitting.

Description is made of a response in the case of LEVEL 2 and LEVEL 36. A physical phenomenon which needs not to be considered and a fixed parameter are inputted, whereby a parameter extracted as LEVEL 2 and a parameter of LEVEL 36, which is destination of conversion, are compared with each other. The step S4-5 is conducted. It is clear that VTO and LAMBDA are common expressions, and U0 (LEVEL 2)=MU0 (LEVEL36), and Cox (LEVEL 2)=Fcox (LEVEL 36) are satisfied. That is, the step 4-6 is selected after the step S4-5, and the parameter of LEVEL 2 is used without any change for LEVEL 36. Parameters having the same meaning each have a different name and expression in some cases; however, they are determined to be the same because function forms thereof are the same.

When the same portion is eliminated from LEVEL 2 and LEVEL 36, a complicated portion is left as a formula expressing a drain current. The function forms of LEVEL 2 and LEVEL 36 are different from each other, and naturally non-linear to a parameter; therefore, the step S4-9 is selected after the step S4-7.

Figure 6:
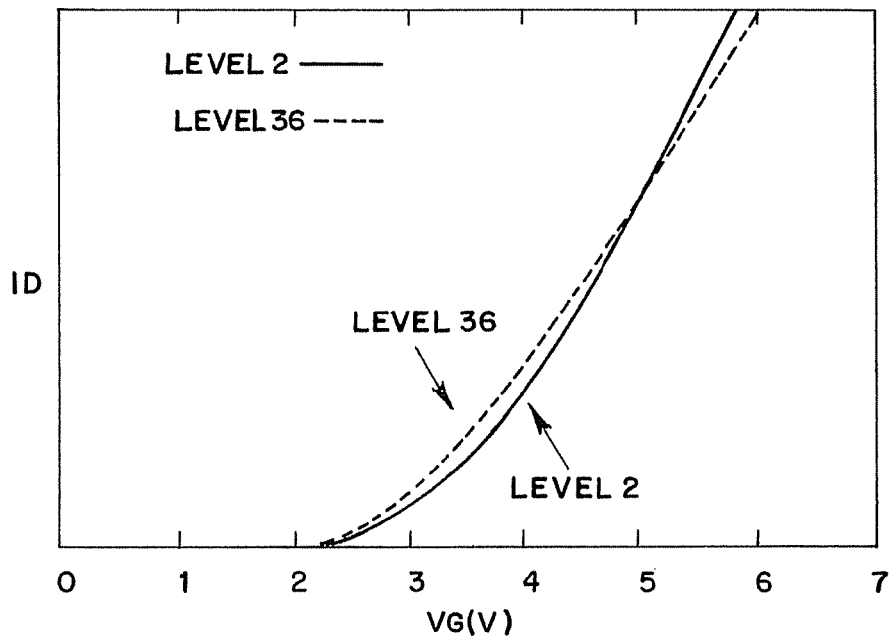
FIG. 6 shows a VG-ID curve of LEVEL 2 drawn using an extracted parameter, and a VG-ID curve of LEVEL 36 drawn using the extracted parameter which is converted into that for LEVEL 36.

When a curve of a drain current with respect to a drain voltage is drawn fixing that vgs=5 is satisfied and assuming that VTO=2 and ETA=7 (default) be satisfied, left parameters are VI and ME. Formulas concerning Ids are partially differentiated with respect to VI and ME, and the nonlinear least squares method is performed using these formulas. From thus obtained data and curve data of LEVEL 2, it is determined that VI=3.5 and ME=2.5 are satisfied by a calculation algorithm. Here, a VD-ID curve is mainly focused, and fitting is performed only for parameters such as VI and ME. Note that VD and ID correspond to vds and ids in the above description respectively. It is preposterous to spend a lot of time for parameter conversion; therefore, a parameter as a target of conversion is required to be limited. In order to perform fitting more finely, a VG-ID curve is also considered. Note that VG and ID correspond to vgs and ids in the above description respectively. FIG. 5 shows the VD-ID curve, and FIG. 6 shows the VG-ID curve. Here, a vertical axis is a linear scale. Further, scales are not drawn since the vertical axis has a value which varies depending on a dielectric constant and the channel length (width).

As described in this embodiment, by the invention, calculation time can be reduced while high physical precision is kept for the circuit operation test. In addition, it becomes easier to modify the model characteristics table, the model determining method, and the parameter converting method. As a result, a semiconductor device can be designed effectively.

What is claimed is:

1. An electronic processing device for setting a parameter, comprising:
    a input portion to which a first model of a circuit element characteristic and a physical phenomenon list thereof are inputted,
    a storage unit configured to store a model characteristics table which includes a plurality of electric element characteristics and physical phenomenon lists, and a plurality of measurement data of an electronic element,
    a model determination unit configured to determine a second model of a circuit element characteristic corresponding to the first model from the model characteristic table,
    a parameter extracting unit configured to extract a parameter of the second model of the circuit element characteristic determined by the model determination unit by fitting the plurality of the measurement data to a function which expresses the second model of the circuit element characteristic, and
    a parameter conversion unit configured to convert the parameter of the second model of the circuit element characteristic so as to meet the first model of the circuit element characteristic,
    wherein the parameter of the second model of the circuit element characteristic is converted into a parameter of the first model of the circuit element characteristic so that an effect by a physical phenomenon not indicated by the second model but indicated by the first model is eliminated.

2. The electronic processing device according to claim 1, wherein the circuit element in each of the first and second models is a thin film transistor.

3. The electronic processing device according to claim 1, wherein the first model of a circuit element characteristic has higher physical precision than the second model of a circuit element characteristic.

4. The electronic processing device according to claim 1, wherein the physical phenomenon list of the first model is one of a channel length modulation, a subthreshold leak current, a mobility deterioration, a kink effect, a temperature dependency, and a Drain Induced Barrier Lowering.

5. The electronic processing device according to claim 1, wherein the physical phenomenon lists comprise a channel length modulation, a subthreshold leak current, a mobility deterioration, a kink effect, a temperature dependency, and a Drain Induced Barrier Lowering.

6. An electronic processing device for testing a circuit operation, comprising:
    a input portion to which a first model of a circuit element characteristic and a physical phenomenon list thereof are inputted,
    a storage unit configured to store a model characteristics table which includes a plurality of electric element characteristics and physical phenomenon lists, and a plurality of measurement data of an electronic element,
    a model determination unit configured to determine a second model of a circuit element characteristic corresponding to the first model from the model characteristic table,
    a parameter extracting unit configured to extract a parameter of the second model of the circuit element characteristic determined by the model determination unit by fitting the plurality of the measurement data to a function which expresses the second model of the circuit element characteristic and,
    a parameter conversion unit configured to convert the parameter of the second model of the circuit element characteristic so as to meet the first model of the circuit element characteristic, and
    a circuit operation test unit configured to perform a circuit operation test by using the converted parameter and the first model of the circuit element characteristic,
    wherein the parameter of the second model of the circuit element characteristic is converted into a parameter of the first model of the circuit element characteristic so that an effect by a physical phenomenon not indicated by the second model but indicated by the first model is eliminated.

7. The electronic processing device according to claim 6, wherein the circuit element in each of the first and second models is a thin film transistor.

8. The electronic processing device according to claim 6, wherein the first model of a circuit element characteristic has higher physical precision than the second model of a circuit element characteristic.

9. The electronic processing device according to claim 6, wherein the physical phenomenon list of the first model is one of a channel length modulation, a subthreshold leak current, a mobility deterioration, a kink effect, a temperature dependency, and a Drain Induced Barrier Lowering.

10. The electronic processing device according to claim 6, wherein the physical phenomenon lists comprise a channel length modulation, a subthreshold leak current, a mobility deterioration, a kink effect, a temperature dependency, and a Drain Induced Barrier Lowering.

11. A parameter setting method, comprising the steps of:
    inputting a first model of a circuit element characteristic, and a physical phenomenon list thereof into a processor;
    selecting a second model of a circuit element characteristic corresponding to the first model from a model characteristics table on the basis of the physical phenomenon list of the first model of the circuit element characteristic in the processor, wherein the model characteristics table including a plurality of electronic element characteristics and physical phenomenon lists thereof;
    extracting a parameter of the second model by using a measurement data of an electronic element in the processor by fitting the measurement data to a function which expresses the second model; and
    converting the extracted parameter of the second model of the circuit element characteristic so as to meet the first model of the circuit element characteristic,
    wherein the parameter of the second model of the circuit element characteristic is converted into a parameter of the first model of the circuit element characteristic so that an effect by a physical phenomenon not indicated by the second model but indicated by the first model is eliminated.

12. The parameter setting method according to claim 11, wherein the circuit element in each of the first and second models is a thin film transistor.

13. The parameter setting method according to claim 11, wherein the first model of a circuit element characteristic has higher physical precision than the second model of a circuit element characteristic.

14. The parameter setting method according to claim 11, wherein the physical phenomenon list of the first model is one of a channel length modulation, a subthreshold leak current, a mobility deterioration, a kink effect, a temperature dependency, and a Drain Induced Barrier Lowering.

15. The parameter setting method according to claim 11, wherein the physical phenomenon lists comprise a channel length modulation, a subthreshold leak current, a mobility deterioration, a kink effect, a temperature dependency, and a Drain Induced Barrier Lowering.

16. A circuit operation testing method, comprising the steps of:

inputting a first model of a circuit element characteristic, and a physical phenomenon list thereof into a processor;

selecting a second model of a circuit element characteristic corresponding to the first model from a model characteristics table on the basis of the physical phenomenon list of the first model of the circuit element characteristic in the processor, wherein the model characteristics table including a plurality of electronic element characteristics and physical phenomenon lists thereof;

extracting a parameter of the second model by using a measurement data of an electronic element in the processor by fitting the measurement data to a function which expresses the second model;

converting the extracted parameter of the second model of the circuit element characteristic so as to meet the first model of the circuit element characteristic; and testing a circuit operation by using the converted parameter and the first model of the circuit element characteristic, wherein the parameter of the second model of the circuit element characteristic is converted into a parameter of the first model of the circuit element characteristic so that an effect by a physical phenomenon not indicated by the second model but indicated by the first model is eliminated.

17. The circuit operation testing method according to claim 16, wherein the circuit element in each of the first and second models is a thin film transistor.

18. The circuit operation testing method according to claim 16, wherein the first model of a circuit element characteristic has higher physical precision than the second model of a circuit element characteristic.

19. The circuit operation testing method according to claim 16, wherein the physical phenomenon list of the first model is one of a channel length modulation, a subthreshold leak current, a mobility deterioration, a kink effect, a temperature dependency, and a Drain Induced Barrier Lowering.

20. The circuit operation testing method according to claim 16, wherein the physical phenomenon lists comprise a channel length modulation, a subthreshold leak current, a mobility deterioration, a kink effect, a temperature dependency, and a Drain Induced Barrier Lowering.

* * * * *